(12) United States Patent
Mangum et al.

(10) Patent No.: US 9,269,565 B2
(45) Date of Patent: *Feb. 23, 2016

(54) METHOD FOR IMPROVING PERFORMANCE OF A SUBSTRATE CARRIER

(71) Applicant: Veeco Instruments Inc., Plainview, NY (US)

(72) Inventors: Joshua Mangum, Baskin Ridge, NJ (US); William E. Quinn, Whitehouse, NJ (US)

(73) Assignee: Veeco Instruments Inc., Plainview, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/920,845

(22) Filed: Jun. 18, 2013

(65) Prior Publication Data

US 2013/0284091 A1     Oct. 31, 2013

Related U.S. Application Data

(63) Continuation of application No. 12/629,467, filed on Dec. 2, 2009, now Pat. No. 8,486,726.

(51) Int. Cl.
*H01L 21/66* (2006.01)
*H01L 21/02* (2006.01)

(52) U.S. Cl.
CPC .......... *H01L 21/02104* (2013.01); *H01L 22/20* (2013.01); *H01L 22/12* (2013.01)

(58) Field of Classification Search
CPC ........ H01L 22/20; H01L 22/12; C23C 14/042
USPC .......................... 438/14; 257/E21.53; 118/720
See application file for complete search history.

(56) References Cited

U.S. PATENT DOCUMENTS 5,675,471 A    10/1997   Kotecki
5,800,622 A     9/1998   Takemi et al.
(Continued)

FOREIGN PATENT DOCUMENTS

CN     1546944 A    11/2004
EP     1850372 A1   10/2007
(Continued)

OTHER PUBLICATIONS

"Office Action" for Japanese Patent Application No. 2012-542044, May 22, 2014, 3 pages, Japanese Patent Office, Japan.
(Continued)

*Primary Examiner* — Fernando L Toledo
*Assistant Examiner* — Neil Prasad
(74) *Attorney, Agent, or Firm* — Kurt Rauschenbach; Rauschenbach Patent Law Group, LLC

(57) ABSTRACT

A method of modifying a substrate carrier to improve process performance includes depositing material or fabricating devices on a substrate supported by a substrate carrier. A parameter of layers deposited on the substrate is then measured as a function of their corresponding positions on the substrate carrier. The measured parameter of at least some devices fabricated on the substrate or a property of the deposited layers is related to a physical characteristic of substrate carrier to obtain a plurality of physical characteristics of the substrate carrier corresponding to a plurality of positions on the substrate carrier. The physical characteristic of the substrate carrier is then modified at one or more of the plurality of corresponding positions on the substrate carrier to obtain desired parameters of the deposited layers or fabricated devices as a function of position on the substrate carrier.

29 Claims, 6 Drawing Sheets

(56) References Cited

U.S. PATENT DOCUMENTS

| | | | |
|---|---|---|---|
| 6,001,183 | A | 12/1999 | Gurary et al. |
| 6,100,506 | A | 8/2000 | Colelli et al. |
| 2005/0089699 | A1 | 4/2005 | Lin et al. |
| 2010/0162956 | A1 | 7/2010 | Murakami et al. |

FOREIGN PATENT DOCUMENTS

| | | |
|---|---|---|
| JP | 07-058041 | 6/1995 |
| JP | 10-144773 | 5/1998 |
| JP | 1999/045585 | 10/1999 |
| JP | 2001-217304 A | 8/2001 |
| JP | 2002-76103 A | 3/2002 |
| JP | 2004-40052 A | 2/2004 |
| JP | 2004-052098 | 2/2004 |
| JP | 2004-87576 A | 3/2004 |
| JP | 2004-244298 | 9/2004 |
| JP | 2006-228816 | 8/2006 |
| JP | 2007-246983 | 9/2007 |
| JP | 2009-520452 | 5/2009 |
| JP | 2009-530806 | 8/2009 |
| KR | 10-2009-0064555 | 6/2009 |
| TW | 200739797 A | 10/2007 |
| TW | 200745508 A | 12/2007 |
| WO | 2008/027305 | 3/2008 |
| WO | 2008/027305 A2 | 3/2008 |
| WO | 2008027305 | 3/2008 |
| WO | 2008027305 A2 | 3/2008 |

OTHER PUBLICATIONS

"Office Action" for Taiwanese Patent Application No. 099141935, Jun. 3, 2013, 12 pages, Taiwanese Intellectual Property Office, Taiwan.

"Notification of Transmittal of the International Search Report and the Written Opinion of the International Searching Authority, or the Declaration" for PCT/US2010/056622, Jul. 29, 2011, 9 pages, the International Searching Authority/Korean Intellectual Property Office, Seo-gu, Daejenon, Republic of Korea.

"Notification Concerning Transmittal of International Preliminary Report on Patentability (Chapter I of the Patent Cooperation Treaty)" for PCT/US2010/056622, Jun. 14, 2012, 6 pages, the International Bureau of WIPO, Geneva, Switzerland.

"Second Office Action" for Chinese Patent Application No. 201080048148.2, Dec. 23, 2014, 3 pages, State Intellectual Property Office of the People's Republic of China, Beijing, China.

"Office Action" for Korean Patent Application No. 10-2012-7010911, Dec. 12, 2014, 12 pages, Korean Intellectual Property Office, Republic of Korea.

"Extended European Sarch Report" for EP 10834932.5, Oct. 2, 2014, 6 pages, European Patent Office, Munich, Germany.

"Office Action" for JP 2014-542044, Mar. 31, 2015, 5 pages, Japanese Patent Office, Japan.

"Office Action" For Korean Patent Application No. 10-2012-7010911, Jun. 26, 2015, 10 pages, Korean Intellectual Property Office, Korea.

"Office Action" For Taiwanese Patent Application No. 103101199, Jun. 1, 2015, 5 pages,Taiwanese Intellectual Property Office.

"Office Action" For Taiwanese Patent Application No. 103101199, Jun. 1, 2015, 5 pages, Taiwanese Intellectual Property Office.

FIG. 4A

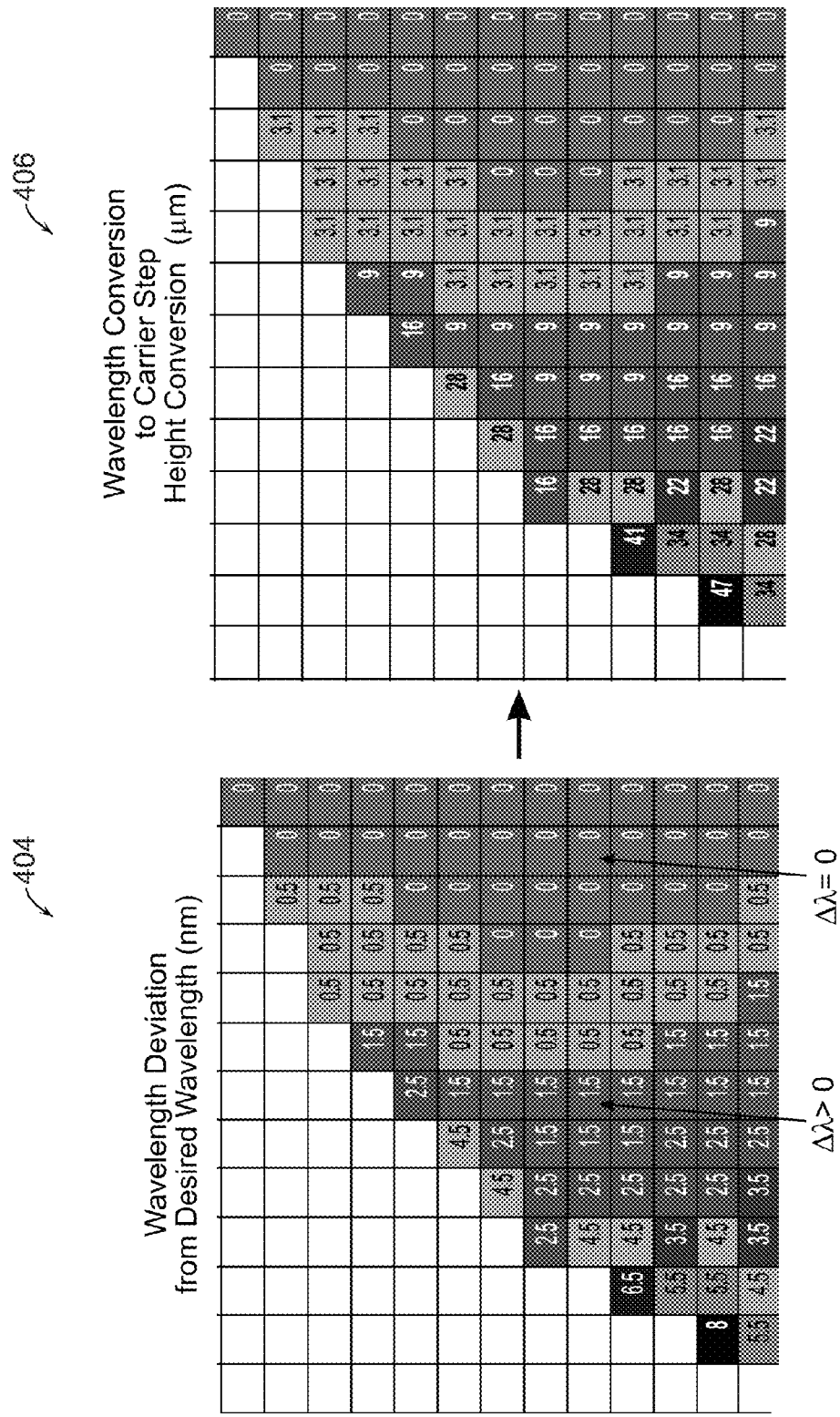

METHOD FOR IMPROVING PERFORMANCE OF A SUBSTRATE CARRIER

CROSS-REFERENCE TO RELATED APPLICATION

This application is a continuation of U.S. Patent application Ser. No. 12/629,467, entitled "Method for Improving Performance of a Substrate Carrier" filed on Dec. 2, 2009. This application is herein incorporated by reference.

The section headings used herein are for organizational purposes only and should not to be construed as limiting the subject matter described in the present application in any way.

INTRODUCTION

Many material processing systems include substrate carriers for supporting and sometimes transporting substrates during processing. The substrate is often a disc of crystalline material that is commonly called a wafer. One such type of material processing system is a vapor phase epitaxy (VPE) system. Vapor phase epitaxy is a type of chemical vapor deposition (CVD) which involves directing one or more gases containing chemical species onto a surface of a substrate so that the reactive species react and form a film on the surface of the substrate. For example, VPE can be used to grow compound semiconductor materials on substrates.

Materials are typically grown by injecting at least one precursor gas and, in many processes, at least a first and a second precursor gas into a process chamber containing the crystalline substrate. Compound semiconductors, such as III-V semiconductors, can be formed by growing various layers of semiconductor materials on a substrate using a hydride precursor gas and an organometalic precursor gas. Metalorganic vapor phase epitaxy (MOVPE) is a vapor deposition method that is commonly used to grow compound semiconductors using a surface reaction of metalorganics and hydrides containing the required chemical elements. For example, indium phosphide could be grown in a reactor on a substrate by introducing trimethylindium and phosphine.

Alternative names for MOVPE used in the art include organometallic vapor phase epitaxy (OMVPE), metalorganic chemical vapor deposition (MOCVD), and organometallic chemical vapor deposition (OMCVD). In these processes, the gases are reacted with one another at the growth surface of a substrate, such as a sapphire, Si, GaAs, InP, InAs or GaP substrate, to form a III-V compound of the general formula $In_XGa_YAl_ZN_AAs_BP_CSb_D$, where X+Y+Z equals approximately one, and A+B+C+D equals approximately one, and each of X, Y, Z, A, B, C, and D can be between zero and one. In various processes, the substrate can be a metal, semiconductor, or an insulating substrate. In some instances, bismuth may be used in place of some or all of the other Group III metals.

Compound semiconductors, such as III-V semiconductors, can also be formed by growing various layers of semiconductor materials on a substrate using a hydride or a halide precursor gas process. In one halide vapor phase epitaxy (HVPE) process, Group III nitrides (e.g., GaN, AN) are formed by reacting hot gaseous metal chlorides (e.g., GaCl or AlCl) with ammonia gas ($NH_3$). The metal chlorides are generated by passing hot HCl gas over the hot Group III metals. One feature of HVPE is that it can have a very high growth rate, up to 100 μm per hour for some state-of-the-art processes. Another feature of HVPE is that it can be used to deposit relatively high quality films because films are grown in a carbon free environment and because the hot HCl gas provides a self-cleaning effect.

In these processes, the substrate is maintained at an elevated temperature within a reaction chamber. The precursor gases are typically mixed with inert carrier gases and are then directed into the reaction chamber. Typically, the gases are at a relatively low temperature when they are introduced into the reaction chamber. As the gases reach the hot substrate, their temperature, and hence their available energy for reaction, increases. Formation of the epitaxial layer occurs by final pyrolysis of the constituent chemicals at the substrate surface. Crystals are formed by a chemical reaction on the surface of the substrate and not by physical deposition processes. Consequently, VPE is a desirable growth technique for thermodynamically metastable alloys. Currently, VPE is commonly used for manufacturing laser diodes, solar cells, and light emitting diodes (LEDs).

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The skilled person in the art will understand that the drawings, described below, are for illustration purposes only. The drawings are not necessarily to scale, emphasis instead generally being placed upon illustrating principles of the teaching. The drawings are not intended to limit the scope of the Applicant's teaching in any way.

FIGS. 4A-4C illustrate an example of a method of relating measurements of emission wavelength of an optical layer or device to the corresponding substrate carrier step height according to the present teaching.

DESCRIPTION OF VARIOUS EMBODIMENTS

Figure 1A:
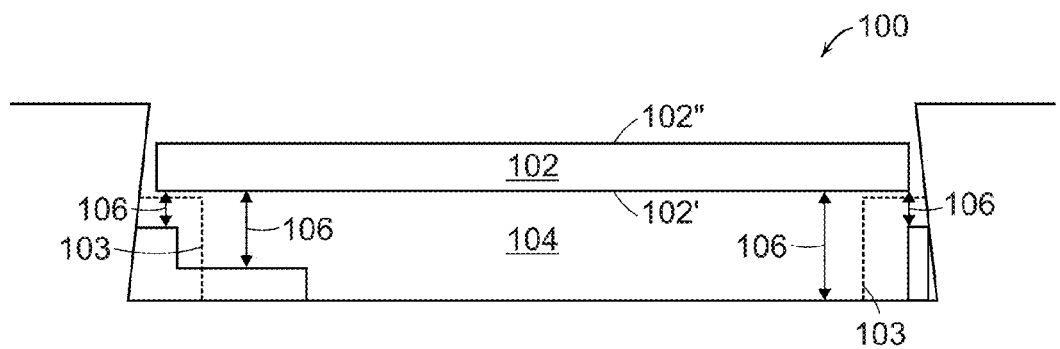
FIG. 1A illustrates a side-view of a substrate carrier that is fabricated or modified according to the present teaching.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the methods of the present teachings may be performed in any order and/or simultaneously as long as the teaching remains operable. Furthermore, it should be understood that the apparatus and methods of the present teachings can include any number or all of the described embodiments as long as the teaching remains operable.

The present teaching will now be described in more detail with reference to exemplary embodiments thereof as shown in the accompanying drawings. While the present teachings are described in conjunction with various embodiments and examples, it is not intended that the present teachings be limited to such embodiments. On the contrary, the present teachings encompass various alternatives, modifications and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

The present teaching relates to methods of manufacturing or modifying substrate carriers in material processing systems to improve process performance. Although some aspects of the present teaching are described in connection with improving the performance of substrate carriers for VPE systems, one skilled in the art will appreciate that the methods of the present invention can be applied to any type of processing system that includes a substrate carrier. Also, although some aspects of the present invention are described in connection with improving the yield of optical layers used for LEDs, lasers, or other optical devices, one skilled in the art will appreciate that the methods of the present invention can be applied to any type of layer and device including any type of optical, electrical, electronic, electro-optic, or acoustic device.

The temperature at the growth surface of the substrate depends on the temperature of the substrate carrier and on the heat transfer between the substrate carrier and the substrate. Heat transfer can occur through conduction, convection, radiation, or through a combination of heat transfer mechanisms. A conduction model of heat transfer assumes that all heat transfer occurs through conduction and that there is no significant heat transfer by convection. The conduction model is most accurate for smaller substrates where typically there are only relatively small gaps between the substrate and the substrate carrier that are on order of 50-100 microns. A convection model of heat transfer assumes that all heat transfer occurs through convection. The convection model is not accurate for many VPE processing systems. A hybrid conduction-convection model assumes that heat transfer occurs through both conduction and convention. This model is more accurate for larger substrates where there can be larger gaps between the substrate and the substrate carrier, which can be on order of 300-500 microns. For example, eight inch substrates can have relatively large gaps between the substrate and the substrate carrier that result in significant amounts of both conduction and convention heat transfer. A radiation model of heat transfer assumes that heat transfer occurs through radiation. This model is accurate for some processes that use opaque substrates, such as silicon substrates.

The temperature of the growth surface of the substrate is also affected by numerous other non-uniformities in the material processing system. For example, the temperature of the growth surface of substrate is affected by non-uniformities in the process gas flow over the substrate, edge effects near the walls of the process chamber, and numerous other defects and asymmetries in the processing system.

In addition, the temperature of the growth surface of the substrate is affected by the shape of the substrate itself. In particular, substrates are usually not completely round. Substrates typically include an orientation flat and they also tend to bow and warp during processing. The shape of the substrate can change during processing. Substrate bow is the deviation of the center point of the median surface of a free, unclamped substrate from the median surface reference plane established by three points equally spaced on a circle with a diameter being a specified amount less than the nominal diameter of the substrate. Like bow, warp is a measurement of the differences between the maximum and minimum distances of the median surface of a free, unclamped substrate from a reference place. Bow and warp of the substrate are functions of many factors, such as internal stress of the substrate, the deposition temperature, the structure being grown on the substrate, and temperature gradients in the process chamber.

Many material processes require very high yields to be competitive in the industry. For example, it is highly desirable to achieve a high process yield of LED and semiconductor laser devices for these devices to be competitive in the industry. In particular, there is currently a need in the industry to improve the yield of VPE processes to manufacture LED and semiconductor laser devices. For many LED and semiconductor laser applications, it is critical to achieve a precise emission wavelength within a few nanometers that is stable over time. Devices with emission wavelengths outside of a certain narrow predetermined range are discarded or sold at a discounted price, reducing the target process yield.

The emission wavelength of these devices depends strongly on the growth temperature and on the solid phase composition of at least some of the semiconductor layers. In particular, growing multiple quantum well structures with the desired emission wavelength and optical properties requires precise control over the temperature, layer thickness, and composition at the growth surface of the substrate. Therefore, the growth temperature must be precisely controlled to achieve uniform material properties over the entire growth surface of substrate in order to achieve a high process yield. Even if the temperature is completely uniform over the substrate, there still could be significant variations in the emission wavelength due to gas phase depletion or compositional differences within the deposition chamber. Therefore, it is sometimes desirable to intentionally induce a temperature non-uniformity to compensate for gas phase and other non-uniformity. In many instances, it is desirable to use the temperature as a control variable since local gas phase composition cannot be easily manipulated.

Therefore, one aspect of the present teaching is a method of manufacturing or modifying substrate carriers in material processing systems, such as VPE systems, to modify temperature uniformity over the substrate being supported by the substrate carrier. In various embodiments of the present teaching, the temperature uniformity can be improved or intentionally reduced in order to improve the process performance.

Substrate bow and warp are functions of the substrate temperature. In some methods of the present teaching, the substrate carrier is fabricated or modified to match the curvature of the surface of the substrate so that the substrate has a more uniform temperature at the growth surface. In other methods, the substrate carrier is fabricated or modified to provide a predetermined temperature profile over the substrate being supported by the substrate carrier.

It is difficult in many cases to accurately measure and control the temperature of substrates being processed and/or local gas phase composition in the process chamber in order to obtain information necessary to fabricate or modify the substrate carrier to compensate for non-uniformities on the surface of the substrate and to compensate for other non-uniformities in the processing system. Temperature measurement is especially difficult when the substrates are optically transparent. One method of modifying a substrate carrier to improve processing performance according to the present teaching includes post growth measurement or analysis of the substrate or devices fabricated on the substrate. The resulting data obtained from the measurement and analysis is then used to modify the substrate carrier or to fabricate a new substrate carrier with specifications that compensate for non-uniform process parameters associated with the substrate, such as temperature and/or gas phase non-uniformities, due to non-uniformities in the processing system.

In a method according to the present teaching, one or more parameters of devices fabricated on the substrate are then measured as a function of their corresponding positions on the substrate carrier. The parameters can be any type of parameter including, but not limited to, optical parameters, electrical parameters, or electro-optic parameters. For example, the parameters can be performance metrics of an electrical or an optical device. In one specific embodiment, the parameter measured is the wavelength of optical emission generated by an optical device, such as a light emitting diode or a semiconductor laser.

FIG. 1A illustrates a side-view of a substrate carrier 100 that is fabricated or modified according to the present teaching. The substrate carrier 100 is designed to support substrates 102 during processing with tabs 103. Numerous types of tabs can be used. For example, the tabs can be triangular-shaped tabs that are positioned at several locations along the edge of the substrate. The substrate carrier 100 can be formed of numerous types of materials, such as graphite, SiC, metal, and ceramic material. For some embodiments of the present teaching, it is desirable to form the substrate carrier 100 of a material that can be easily machined in localized areas or in a predetermined contour. In other embodiments, it is desirable to form the substrate carrier 100 of a material that can easily accept additional materials in localized areas. In yet other embodiments, it is desirable to form the substrate carrier 100 of a material that can accept inserts of different materials or the same material with a different orientation or with modified properties in localized areas.

Figure 1B:
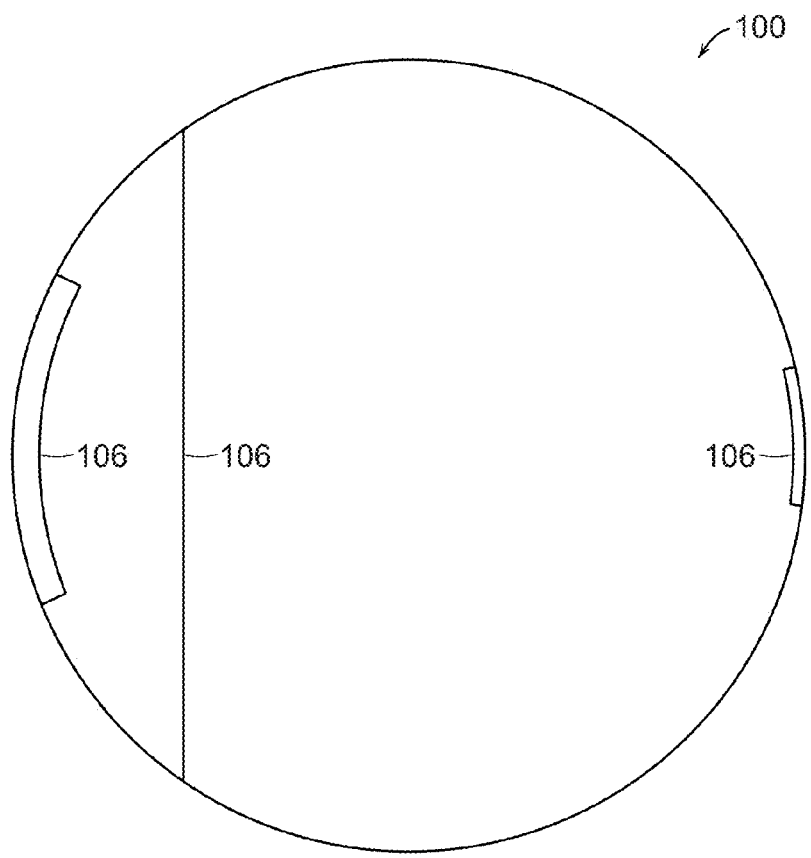
FIG. 1B illustrates a top-view of a substrate carrier that is fabricated or modified according to the present teaching.

The substrate carrier 100 has a multi-step recess 104 for supporting a substrate 102 during processing. The recess 104 has step heights 106 from the bottom of the recess 104 to the bottom surface 102' of the substrate 102. One aspect of the present teaching is that small changes in the step height 106 and/or thermal conductivity of the substrate carrier 100 under the step can change the temperature at the growth surface 102" of the substrate 102 so that it has a more uniform temperature profile or has a predetermined desired temperature profile. FIG. 1B illustrates a top-view of a substrate carrier 100 that is fabricated or modified according to the present teaching. The top-view shows the variable step heights 106 in different patterns extending through the entire substrate 102.

Figure 2:
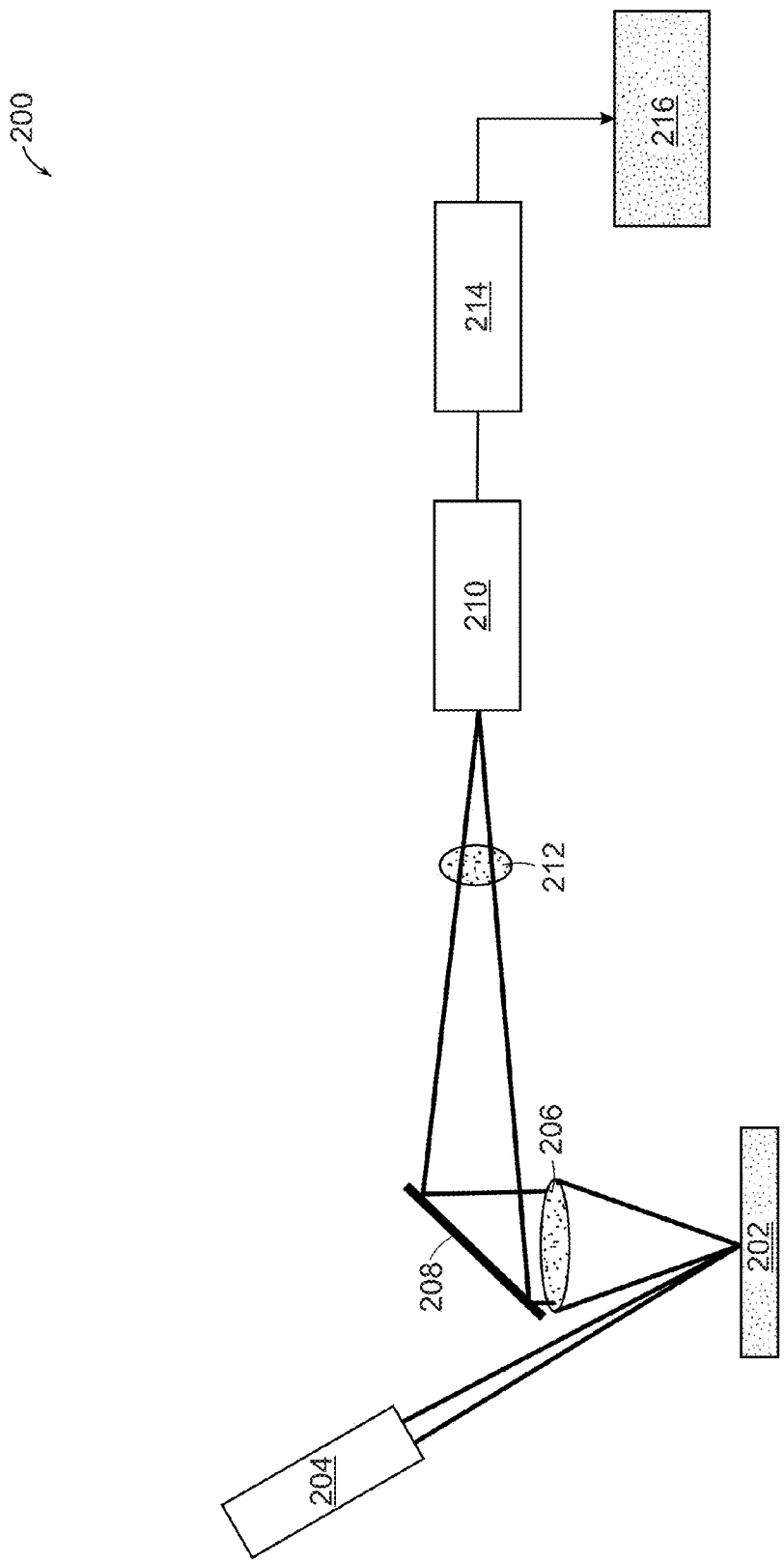
FIG. 2 is a schematic diagram of a photoluminescence instrument that is used to measure the wavelength of optical emission generated by an optical layer or device.

FIG. 2 is a schematic diagram of a photoluminescence instrument 200 that is used to measure the wavelength of optical emissions generated by an optical layer or an optical device fabricated on a substrate 202. The instrument 200 includes a laser 204 that generates an optical beam with a narrow beam width. The laser 204 directs the optical beam to a small area on the surface of the substrate 202 that corresponds to a small area of an optical layer or to a single optical device so that the optical beam can probe the optical device. The substrate 202 is mounted on an X-Y translation stage that translates the substrate 202 under the optical beam so that the optical beam strikes desired areas or any number or all of the optical devices. This technique can also be used to measure emission wavelength of layers grown on the substrate before the optical devices are fabricated. In this case, the emission wavelength in predetermined areas of the substrate is mapped by stepping the substrate under the beam to determine if the wafer will meet the performance specifications before devices are fabricated on the wafer.

The optical beam causes the optical layer or optical device to generate optical emission at its characteristic wavelength. A collimating lens 206 is positioned to direct the collimated beam to a mirror 208 which deflects the optical beam into a monochromator 210. A focusing lens 212 is used to focus the collimated beam into a slit of the monochromator 210. The monochromator 210 passes a selected wavelength to an exit slit. A detector array 214 is positioned to detect the optical beam passed by the exit slit. A data acquisition unit 216 can be used to store the wavelength-position data. The X-Y translation stage translates the substrate 202 to a different area of the optical layer or to a different optical device and then the measurement is repeated. For example, the optical devices can be spaced 2 mm apart and the X-Y Y translation stage can translate the substrate 202 in the horizontal and vertical directions in 2 mm steps.

Figure 3:
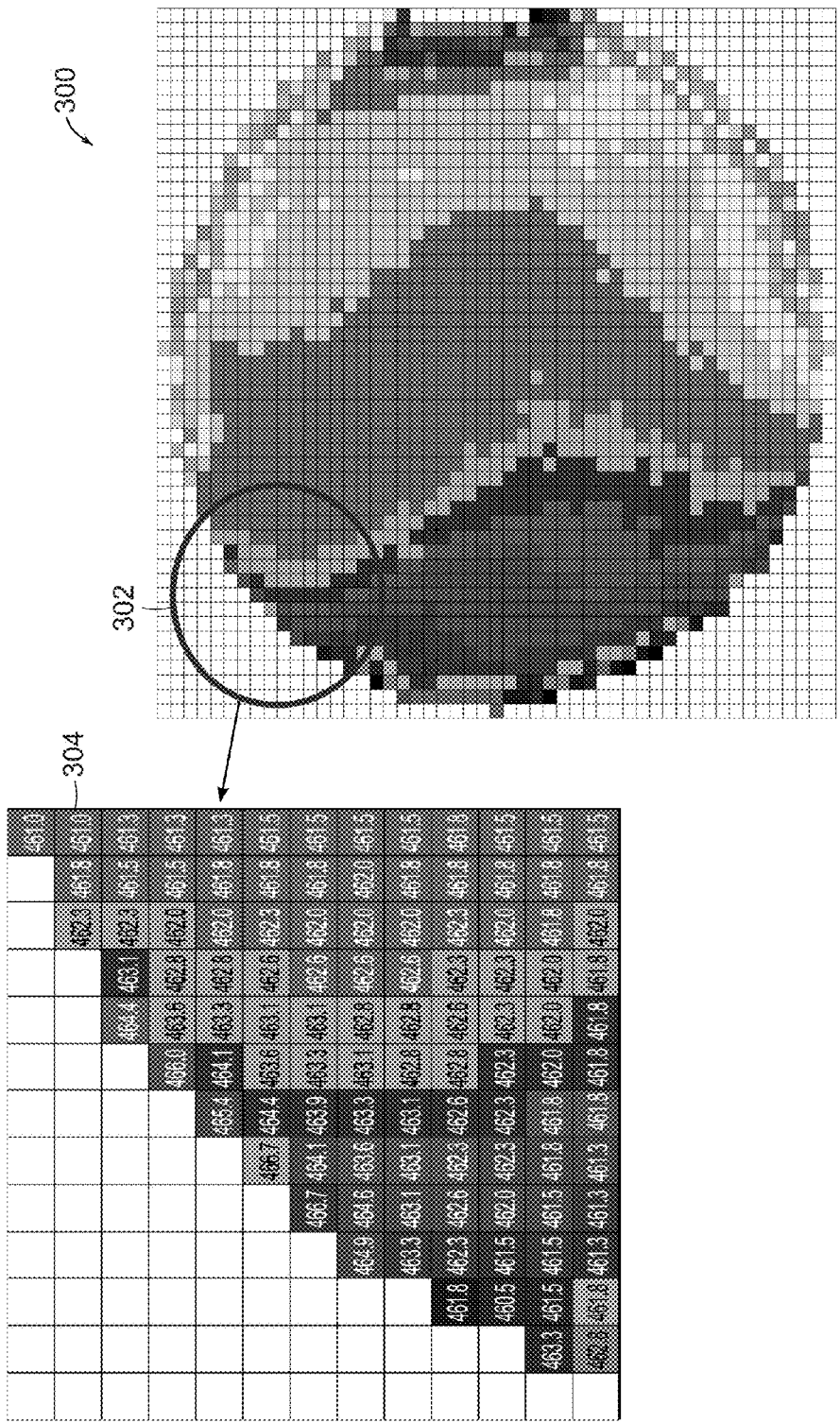
FIG. 3 illustrates results of measurements generated by the photoluminescence instrument described in connection with FIG. 1.

FIG. 3 illustrates sample results of measurements generated by the photoluminescence instrument 200 described in connection with FIG. 2. FIG. 3 illustrates a substrate 300, which in this example is a semiconductor wafer that is divided into pixels that represent areas of an optical layer or individual optical devices. A magnified view of a portion 302 of the substrate 300 is shown to more clearly illustrate the pixels 304. Each of the pixels 304 is associated with an emission wavelength in nanometers of an optical device that is probed by the laser beam in the instrument 200.

In another specific embodiment, the parameter measured is the intensity of optical emission generated by an optical layer that is part of an optical device, such as a light emitting diode or a semiconductor laser. In this embodiment, a laser directs an optical beam to a small area on the surface of the substrate that may correspond to a single optical device so that the optical beam generated by the laser can probe the optical device as described in connection with FIG. 2. The optical beam causes the optical device to generate optical emission. A focusing lens can be used to focus the optical emission. A detector or detector array is used to detect the intensity of the optical emission. A data acquisition unit can be used to store the optical intensity-position data.

Thus, the result of the measurement is a map of the substrate 300 with parameters of the optical layer or optical device presented as a function of their corresponding positions on the substrate 300. In the example shown in FIG. 3, each of the pixels 304 includes a number representing the emission wavelength in nanometers. The positions on the substrate 300 are then related to their corresponding positions on the substrate carrier to obtain a map of the measured optical layer or optical device parameters, which in this example is emission wavelength in nanometers, presented as a function of their corresponding positions on the substrate carrier.

The measured parameters of deposited layers at some positions on the substrate are then related to a physical characteristic of the substrate carrier. For example, the measured parameter can be an optical or an electronic performance metric and the physical characteristic of substrate carrier can be the local depth of the substrate carrier under the layer or device being measured. Also, the measured parameter can be an optical or an electronic performance metric and the physical characteristic of substrate carrier can be the local thermal conductivity or emissivity of the substrate carrier under the layer or device being measured. The result is a plurality of physical characteristics of the substrate carrier corresponding to a plurality of positions on the substrate carrier.

In some embodiments, the relating the measured parameter of layers grown or devices fabricated on the substrate to the physical characteristic of the substrate carrier comprises using a mathematical model to perform the relation. For example, a mathematical model can be used to relate emission wavelength or emission intensity to the local depth or local thermal conductivity of the wafer carrier under the layer or device. More specifically, the surface temperature of the wafer can be calculated from thermodynamic and kinetic reaction equations by using the measured emission wavelength or the film composition of a semiconductor layer on the substrate. Heat transport equations can then be used to relate the wafer surface temperature to the depth or to the local thermal conductivity of the wafer carrier.

Also, in some embodiments, the relating the measured parameter of layers grown or devices fabricated on the substrate to the physical characteristic of the substrate carrier comprises relating empirical data. One advantage of the present teaching is that simple experiments can be performed to obtain empirical data that can be used to determine the shape of the substrate carrier that results in either a uniform temperature or a predetermined temperature profile at the growth surface of a substrate. For example, experimental data from photoluminescence measurements of emission wavelength can be related to the local depth or local thermal conductivity of the wafer carrier under the deposited layer being measured.

Figure 4A:
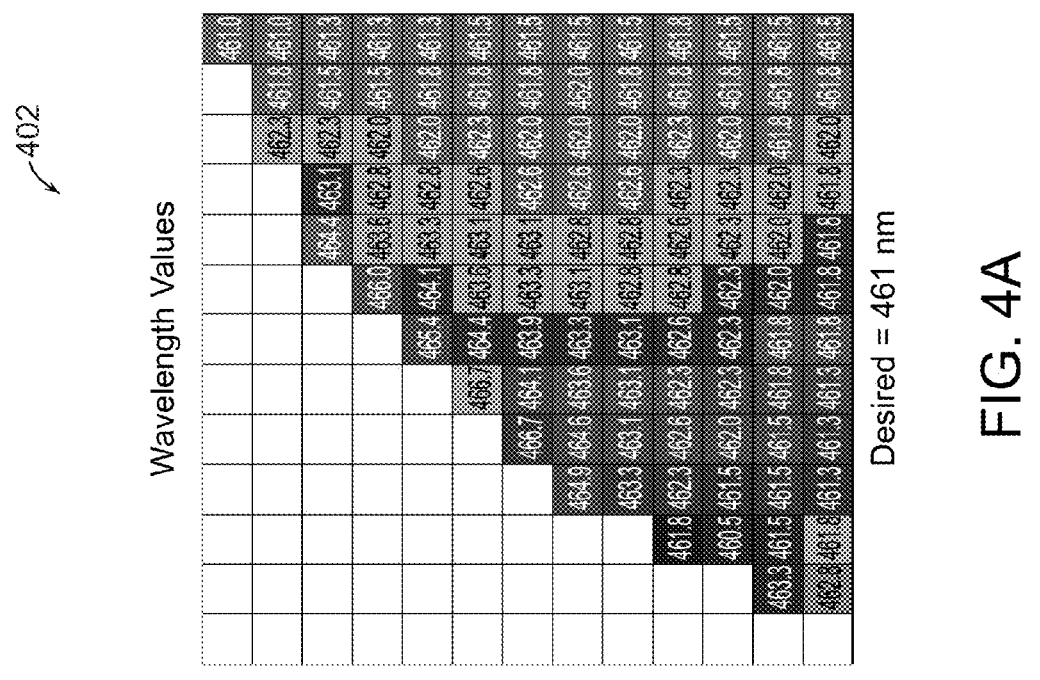

FIGS. 4A-4C illustrate an example of a method of relating measurements of emission wavelength of an optical layer or an optical device to the corresponding substrate carrier step height according to the present teaching. The method includes a first step of mapping the substrate with optical emission wavelength data as a function of position of the optical device. The optical emission wavelength data can be obtained with the photoluminescence instrument described in connection with FIG. 2. The results are shown in FIG. 4A as a map 402 of the substrate with wavelength data corresponding to the position of the deposited layer being measured. In this particular example, the desired wavelength, which is also the average wavelength, is equal to 461 nm.

The emission wavelength deviation from the desired emission wavelength is then determined. The results are shown in FIG. 4B as a map 404 of the substrate with emission wavelength deviation data presented as a function of position on the substrate. If the emission wavelength deviation data is greater than a predetermined value, the step height or other physical characteristic of the substrate carrier is modified to reduce the emission wavelength deviation. For example, in some processes it is desirable to have the emission wavelength deviation be less than or equal to 2 nm.

The emission wavelength difference from the desired emission wavelength is then related to a change in substrate carrier step height. In the example shown, the emission wavelength difference per unit distance is 0.16 nm/μm for a substrate carrier that is about 16 mm thick. In other words, for every desired 0.16 nm change in wavelength, the substrate carrier step height must be changed by one micron. That is, the substrate carrier step height is then either increased or decreased, relative to a fixed position on the wafer, depending on the direction of the desired wavelength change that will change the emission wavelengths to the desired emission wavelength. The results are shown in FIG. 4C as a map 406 representing the wavelength deviation-to-carrier step height conversion in microns, which is determined from the emission wavelength difference per unit distance conversion.

In other embodiments, the emission wavelength values are related directly to an absolute thickness value of the portion of the wafer carrier supporting the particular areas on the substrate. In these embodiments, the substrate is also mapped with optical emission wavelength data as a function of position of the optical layer or the optical device and the result is the map 402 of the substrate with wavelength data corresponding to particular layer or device position. The emission wavelength is then directly related to the absolute thickness of the substrate carrier supporting the substrate. The absolute thickness of the substrate carrier is then either increased or decreased depending on the direction of the desired wavelength change.

The physical characteristic of the substrate carrier 100 is then modified at one or more of the plurality of corresponding positions on the substrate carrier 100 to obtain desired parameters as a function of position on the substrate carrier 100. If the physical characteristic is the substrate carrier step height, then material is either added to or removed from the substrate carrier 100. Material can be added to the substrate carrier by numerous means, such as evaporation, sputtering, platting, or CVD. Portions of the substrate carrier can be masked so that material is deposited in only certain areas of the substrate carrier.

Material can be removed from the substrate carrier 100 in any one of numerous ways. For example, there are numerous methods of machining localized areas in the recess 104 of the substrate carrier 100. The substrate carrier can be machined with continuous contours or can be machined in localized areas by pecking with a specialized cutting tool. For example, a small diameter diamond cutting tool can be used. Cutting tools that operate at high speeds, such as cutting tools that use air turbine spindles can provide the relatively high accuracy needed for machining small pixels.

Figure 5:
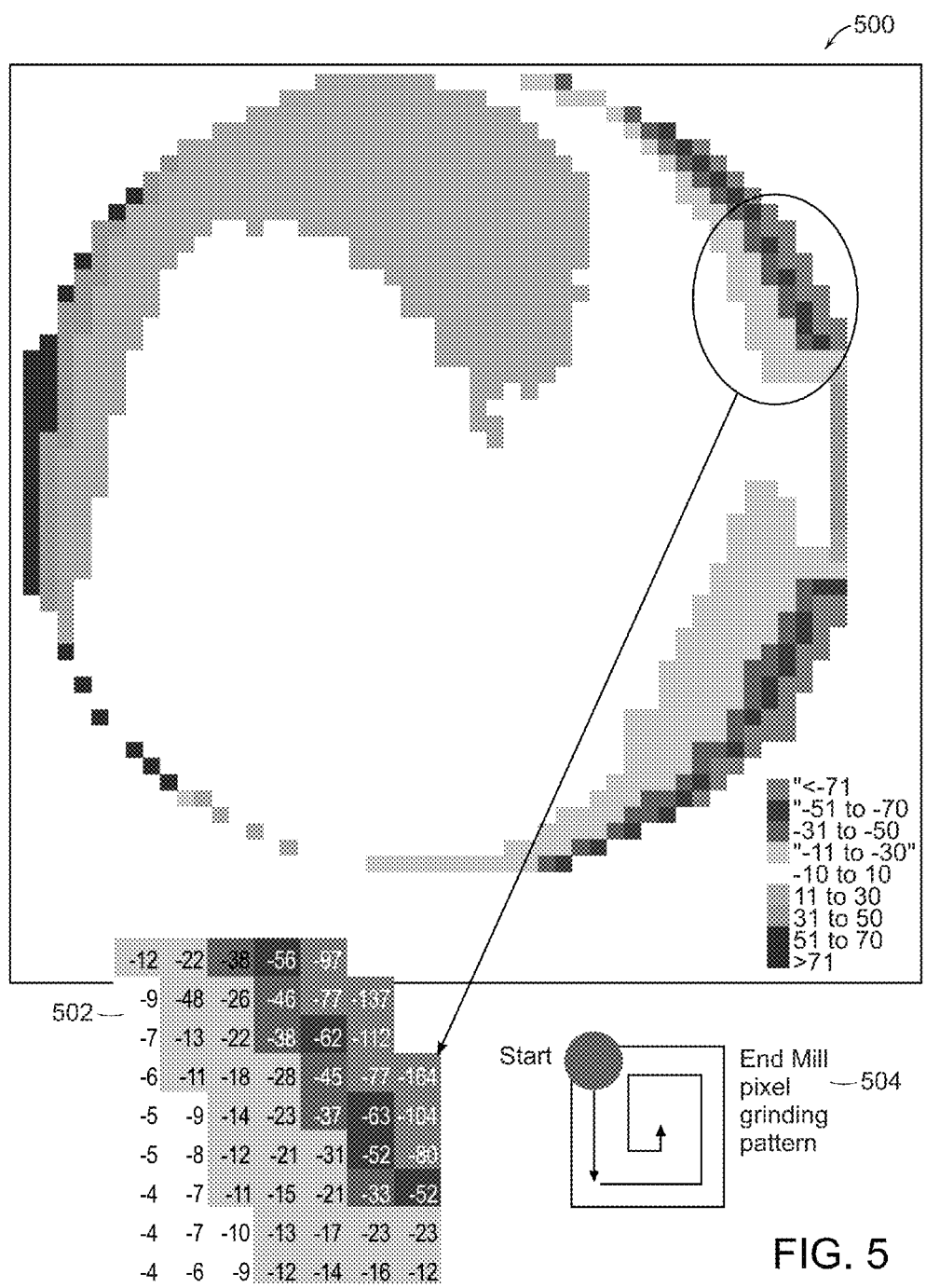
FIG. 5 shows a pixel pecking map of a substrate carrier that is mapped with the relative substrate carrier step height for achieving a desired temperature at the growth surface of each of the layer or device areas on the substrate.

FIG. 5 shows a pixel pecking map 500 of a substrate carrier that is mapped with the relative substrate carrier step height for achieving a desired temperature at the growth surface of each of the layer or device areas on the substrate. FIG. 5 shows an expanded view of one area of the map 502 that indicates numbers in each of the pixels which correspond to particular layer areas or devices fabricated on a substrate positioned above the pixel. The substrate carrier step height is then either increased or decreased depending on the direction of the parameter change. For example, in one embodiment, the substrate carrier step height is then either increased or decreased depending on the desired wavelength change necessary to achieve the desired emission wavelength. In this example, each of the substrate carrier step heights is negative meaning that material needs to be removed in each of the pixel areas. In various embodiments, the substrate carrier can be designed so that material only needs to be removed to achieve a desired temperature at the growth surface of each of the pixels. The amount of material to be removed is proportional to the number in the layer area or device.

In various methods according to the present teaching, a computer controlled pecking end mill can be used to remove substrate carrier material in some or all of the pixels. FIG. 5 also shows an end mill grinding pattern 504 that can be used to remove material in particular pixels. A CNC pecking machine tool can be used to move an end mill in the grinding pattern 504 shown in FIG. 5 for each of the pixels requiring a depth change. Once the end mill finished the grinding pattern in one pixel, the end mill is raised and then moved to another pixel. The milling is performed serially until the depth of all pixels are changed to the depth that results in desired temperature at the growth surface of a substrate positioned over the substrate carrier.

In other methods, a CNC or other type of computer controlled milling machine is used to modify the surface of the substrate carrier to form a continuous contour that provides the desired temperature at the growth surface of a substrate positioned over the substrate carrier. Numerous other methods can be used to contour the surface of the substrate carrier. Some of these methods use computer controlled tools for performing laser ablation, electrostatic discharge, or water jet machining in predetermined pixels.

Other methods combine non-selective material removal means, such as chemical or dry etching, with one or more masking steps that deposit at least one material that is resistant to the removal means in certain predetermined areas. In some methods, the substrate carrier can be masked or partially masked with a material that causes non-uniform etching of the substrate carrier to create a continuous contour having a predetermined shape that provides the desired temperatures at the growth surface of the substrates. In other methods, an erodible variable thickness masking material that is resistant to the removal means is deposited over at least a portion of the substrate carrier. In these methods, areas with relatively thin erodible masking material will experience more etching than areas with thicker erodible material and, therefore, more carrier surface material will be removed from these areas.

In some methods, the physical characteristic is the thermal conductivity of the substrate carrier and the thermal conductivity is changed in local regions of the substrate carrier. For example, in certain localized regions, material can be inserted into the localized regions replacing at least some of the substrate carrier material in those regions. In some methods, a portion of the substrate carrier is removed in a localized region and is replaced with material having a different thermal conductivity. The material having a different thermal conductivity can be a different material or it can be the same material, but positioned with a different orientation that exhibits a different thermal conductivity. In other methods, the thermal conductivity is changed in localized regions by performing material processing at the local region. For example, the localized region can be irradiated with an ion beam that changes the thermal conductivity.

Equivalents

While the applicant's teaching are described in conjunction with various embodiments, it is not intended that the applicant's teaching be limited to such embodiments. On the contrary, the applicant's teaching encompass various alternatives, modifications, and equivalents, as will be appreciated by those of skill in the art, which may be made therein without departing from the spirit and scope of the teaching.

What is claimed is:

1. A substrate carrier comprising: a recess that supports a bottom surface of one or more substrates, at least one physical characteristic of localized areas of the recess being modified by first relating a measured parameter of a layer deposited on a top surface of the one or more substrates, which are opposite to the bottom surfaces of the one or more substrates, to the at least one physical characteristic of the recess, and then modifying the at least one physical characteristic of the localized areas of the recess in response to the measured parameter.

2. The substrate carrier of claim 1 wherein the substrate carrier is formed of at least one of graphite, SiC, metal, and ceramic material.

3. The substrate carrier of claim 1 wherein the substrate is formed of at least one of a semiconductor, metal, and an insulator material.

4. The substrate carrier of claim 1 wherein the relating the measured parameter of the layer deposited on the substrate to the physical characteristic of the recess comprises using a mathematical model.

5. The substrate carrier of claim 1 wherein the relating the measured parameter of the layer deposited on the substrate to the physical characteristic of the recess comprises relating empirical data.

6. The substrate carrier of claim 1 wherein the physical characteristic of the recess comprises a local depth of the substrate carrier.

7. The substrate carrier of claim 1 wherein the physical characteristic of the recess comprises a local thermal conductivity of the substrate carrier.

8. The substrate carrier of claim 1 wherein the physical characteristic of the recess comprises a local emissivity of the substrate carrier.

9. The substrate carrier of claim 1 wherein the physical characteristic of the recess comprises a local mechanical property of the substrate carrier.

10. The substrate carrier of claim 1 wherein the measured parameter comprises a performance metric.

11. The substrate carrier of claim 1 wherein the measured parameter is selected from the group consisting of an optical parameter of the layer deposited on the substrate, an electrical parameter of the layer deposited on the substrate, and an electro-optic parameter of the layer deposited on the substrate.

12. The substrate carrier of claim 1 wherein the relating the measured parameter comprises relating emission wavelength of the deposited layer in particular locations to a corresponding local area of the recess.

13. The substrate carrier of claim 1 wherein the modifying the localized areas of the recess comprises removing material from the localized areas.

14. The substrate carrier of claim 13 wherein the material is removed in discrete localized areas.

15. The substrate carrier of claim 13 wherein the material is removed to form a continuous contour.

16. The substrate carrier of claim 13 wherein the material is removed from the localized areas of the recess by at least one of machining, laser ablation, chemical etching, and electrostatic discharge.

17. The substrate carrier of claim 1 wherein the modifying localized areas of the recess comprises adding material to the substrate carrier.

18. The substrate carrier of claim 1 wherein the modifying localized areas of the recess comprises changing thermal conductivity in a local region of the substrate carrier.

19. The substrate carrier of claim 18 wherein the thermal conductivity is changed in the localized areas by inserting a material into the local region.

20. The substrate carrier of claim 18 wherein the thermal conductivity is changed in the localized areas by performing material processing at the local region.

21. The substrate carrier of claim 1 wherein the modifying the localized areas of the recess comprises changing the emissivity in a local region of the substrate carrier.

22. The substrate carrier of claim 1 wherein the modifying the localized areas of the recess comprises changing a local mechanical property in a local region of the substrate carrier.

23. The substrate carrier of claim 1 wherein the recess has a predetermined depth contour.

24. The substrate carrier of claim 1 wherein the recess has a predetermined thermal contour.

25. The substrate carrier of claim 1 wherein the deposited layer comprises fabricating a multiple quantum well structure by vapor phase epitaxy.

26. The substrate carrier of claim 1 wherein the measured parameter comprises optical intensity.

27. The substrate carrier of claim 1 wherein the measured parameter comprises optical emission wavelength.

28. A substrate carrier fabricated by a process comprising:
a) depositing a layer on a substrate supported by a substrate carrier;
b) measuring a parameter of the layer deposited on the substrate as a function of its corresponding position on the substrate carrier;
c) relating the measured parameter corresponding to the position on the substrate to a physical characteristic of the substrate carrier to obtain physical characteristics of the substrate carrier corresponding to a position on the substrate; and
d) modifying the physical characteristic of the substrate carrier corresponding to the position on the substrate to obtain a desired parameter of the deposited layer on the substrate as a function of position on the substrate carrier.

29. A substrate carrier fabricated by a process comprising:
a) depositing at least one layer on a substrate supported by a substrate carrier;
b) measuring a temperature dependent process parameter of the at least one layer deposited on the substrate as a function of its corresponding position on the substrate carrier;
c) relating the measured parameter of the at least one layer deposited on the substrate to a depth of the substrate carrier to obtain a plurality of measured parameters as a function of depths of the substrate carrier; and
d) modifying the depth of the substrate carrier at a plurality of positions to obtain desired parameters of the deposited at least one layer on the substrate as a function of the corresponding position on the substrate.

* * * * *